United States Patent [19]
Kitahara

[11] Patent Number: 5,977,845
[45] Date of Patent: Nov. 2, 1999

[54] LC COMPOSITE PART WITH NO ADVERSE MAGNETIC FIELD IN THE CAPACITOR

[75] Inventor: Naoto Kitahara, Saitama-ken, Japan

[73] Assignee: Mitsubishi Materials Corporation, Tokyo, Japan

[21] Appl. No.: 08/949,820

[22] Filed: Oct. 14, 1997

[30] Foreign Application Priority Data

| Oct. 14, 1996 | [JP] | Japan | 8-270831 |
| Oct. 14, 1996 | [JP] | Japan | 8-270833 |
| Oct. 14, 1996 | [JP] | Japan | 8-270834 |

[51] Int. Cl.$^6$ ........................................ H03H 7/01
[52] U.S. Cl. ........................................ 333/184; 333/185
[58] Field of Search ........................ 333/181, 184, 333/185

[56] References Cited

U.S. PATENT DOCUMENTS

| 4,888,568 | 12/1989 | Kawaguchi | 333/184 X |
| 5,592,134 | 1/1997 | Ogata et al. | 333/185 |
| 5,602,517 | 2/1997 | Kaneko et al. | 333/185 |
| 5,610,565 | 3/1997 | Maeda et al. | 333/185 X |

*Primary Examiner*—Robert Pascal
*Assistant Examiner*—Justin P. Bettendorf
*Attorney, Agent, or Firm*—Oblon, Spivak, McClelland, Maier & Neustadt, P.C.

[57] ABSTRACT

An LC filter including a substrate having a magnetic and dielectric material. The LC filter includes inductors having two spiral structures arranged so that magnetic fluxes generated at the insides of the spiral structures are parallel and in mutually reverse directions. Also included are plane plate capacitors between the two spiral structures.

24 Claims, 11 Drawing Sheets

LC COMPOSITE PART WITH NO ADVERSE MAGNETIC FIELD IN THE CAPACITOR

BACKGROUND OF THE INVENTION

1. Field of the Invention

The present invention relates to an LC composite part constituted by forming inductors and capacitors at an inside of a substrate including both a magnetic material and a dielectric material.

2. Discussion of the Background

Background EMI (Electro Magnetic Interference) filters have been used as a countermeasure for high frequency noise in an electronic device. Generally, an EMI filter is constituted by combining individual capacitor and inductor elements. Many types of these EMI filters have been proposed, such as L-type EMI filters constituted by combining one capacitor and one inductor and π-type filters constituted by combining two capacitors and one inductor.

When an EMI filter is constituted by combining capacitor and inductor elements in this way, a total size of the EMI filter is magnified, a wide area is needed in attaching the EMI filter to a circuit board or the like, and a greater number of steps are required to combine the individual elements.

In recent years, there have been proposed filters which resolve the aforementioned problems. These filters include incorporating capacitors and inductors in a single chip (please see Japanese Unexamined Patent Publication No. JP-A-8-65080 and Japanese Unexamined Patent Publication No. JP-A-8-148381).

According to these publications, there is proposed a filter part having a chip-like shape where conductive films operating as inductors and capacitors are formed on a plurality of layers. Each of the layers include a mixture of a dielectric material and a magnetic material. In addition, the plurality of layers are laminated and sintered, thereby forming an LC filter of an L-type or a π-type at an inside portion of the filter part.

All of the inductors formed at the inside of the filter part described in the publications have linear conductive films sandwiched by mixtures including a dielectric material and a magnetic material. Therefore, it is difficult to provide a large inductance in limited dimensions.

A large inductance may be formed with an inductor having a spiral structure extending over a plurality of layers. This can be accomplished by forming half-round or full-round conductive films on a single layer including a mixture of a dielectric and magnetic material. The conductive films are extended to a next layer via conductors in through holes. However, when such a spiral inductor structure is formed in the mixture substrate, the magnetic forces of the inductors adversely effect an influence on a capacitor contiguous to the inductor at the inside of the substrate. Therefore, the characteristic of the filter is significantly deteriorated.

Further, a multi-stage LC filter is preferably to create an LC filter circuit with excellent filter characteristic. However, when a multi-stage type LC filter using the L-type and π-type filter proposed in the above-mentioned publications, the dimensions of the filter are excessively enlarged to provide a large inductance.

Further, when the mixture of the dielectric and magnetic material is used, the inductor has a considerably large residual capacitor that is equivalently connected to the inductor in parallel, because the dielectric material is included. Accordingly, an LC filter circuit with excellent characteristics is difficult to obtain.

SUMMARY OF THE INVENTION

Accordingly, one object of the present invention to provide an LC composite part by forming inductors in a spiral structure and capacitors in the same substrate, yet restraining an adverse influence on the capacitors caused by magnetic fields generated by the inductors.

Another object of the present invention is to provide an LC composite part where an LC filter circuit of a multi-stage type is formed in limited dimensions.

Yet another object of the present invention is to provide an LC composite part having excellent filter characteristic even with a presence of a residual capacitor.

According to a first aspect of the present invention, there is provided an LC composite part including a substrate having a magnetic and a dielectric material. Also included are inductors having two spiral structures formed at an inside of the substrate. The inductors are arranged and connected with each other so that magnetic fluxes at the insides of the spiral structures are in parallel with each other and directed in mutually reverse directions. In addition, capacitors having plane plates in parallel with each other are formed at the inside of the substrate.

Accordingly, a magnetically closed circuit is formed where, even if the capacitors are arranged at locations other than passages of the magnetic fluxes, almost no influence of the magnetic field is effected. Thus, a circuit having a desired characteristic can be formed in the substrate. In this case, it is preferable that the capacitors are formed at positions sandwiched by the two spiral inductor structures. Therefore, the size of part is reduced.

Also, according to the first LC composite part of the present invention, one of the parallel plane plate constituting capacitors may be connected to intermediate positions of the inductors. Here, the intermediate position does not have to be located at the center, but signifies a position somewhere at the midway of the inductor. By connecting the capacitors to the intermediate positions, a desired filter circuit can be achieved.

According to a second aspect of the present invention, there is provided an LC composite part including a substrate having a magnetic and a dielectric material, a first and a second terminal electrode formed on external faces of the substrate, and ground electrodes formed on external faces of the substrate. In addition, the LC composite part includes inductors having conductor films formed in a spiral shape extending over a plurality of layers formed at an inside of the substrate, which are arranged between the first terminal electrode and the second terminal electrode. Also, included are two or more capacitors formed at the inside of the substrate arranged between intermediate points of the inductors respectively different from each other and the ground electrodes.

Therefore, with inductors including the conductive films formed in a spiral shape extending over the plurality of layers, large inductances can be formed with small dimensions. Also, since the substrate is a mixture of dielectric and magnetic material, the capacitors may be formed at the intermediate points of the inductors (i.e., at the midway of the conductive films constituting the inductors). Accordingly, an LC filter circuit of a multistage type can be formed with small dimensions.

According to a third aspect of the present invention, there is provided an LC composite part including substrates each having a magnetic and dielectric material. The LC composite part includes inductors and capacitors formed at an inside of the substrate to provide a low pass LC filter circuit of a π-type, a T-type or a multi-stage type. In addition, when a cut off frequency of the LC circuit is designated by a notation fc, an inductance of one of the inductors is designated by a notation L, and a capacitance of one of the inductors as a residual capacitor equivalently connected to one of the inductors in parallel is designated by a notation C, the residual capacitor is provided with the capacitance satisfying the following equation:

$$\log(fc)+0.6 \leq \log\{1/[2(2\pi\sqrt{LC})]\} \leq \log(fc)+1.5. \quad (1).$$

Further, it is not preferable when $$\log(fc)+1.5 \leq \log\{½(2\pi\sqrt{LC})\},$$

because the attenuation coefficient is decreased, and therefore the filter characteristic is deteriorated.

In addition, although it may be theoretically preferable in view of the insertion loss characteristic to have:

$$\log\{1/(2\pi\sqrt{LC})\} < \log(fc)+0.6,$$

a material with an extremely small loss is needed. Currently, this is difficult to obtain with available materials. Incidentally, the dielectric loss of currently available materials is substantially 0.03 and the magnetic loss is substantially 0.5.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

An explanation of the embodiments of the present invention will now be given.

Figure 1:
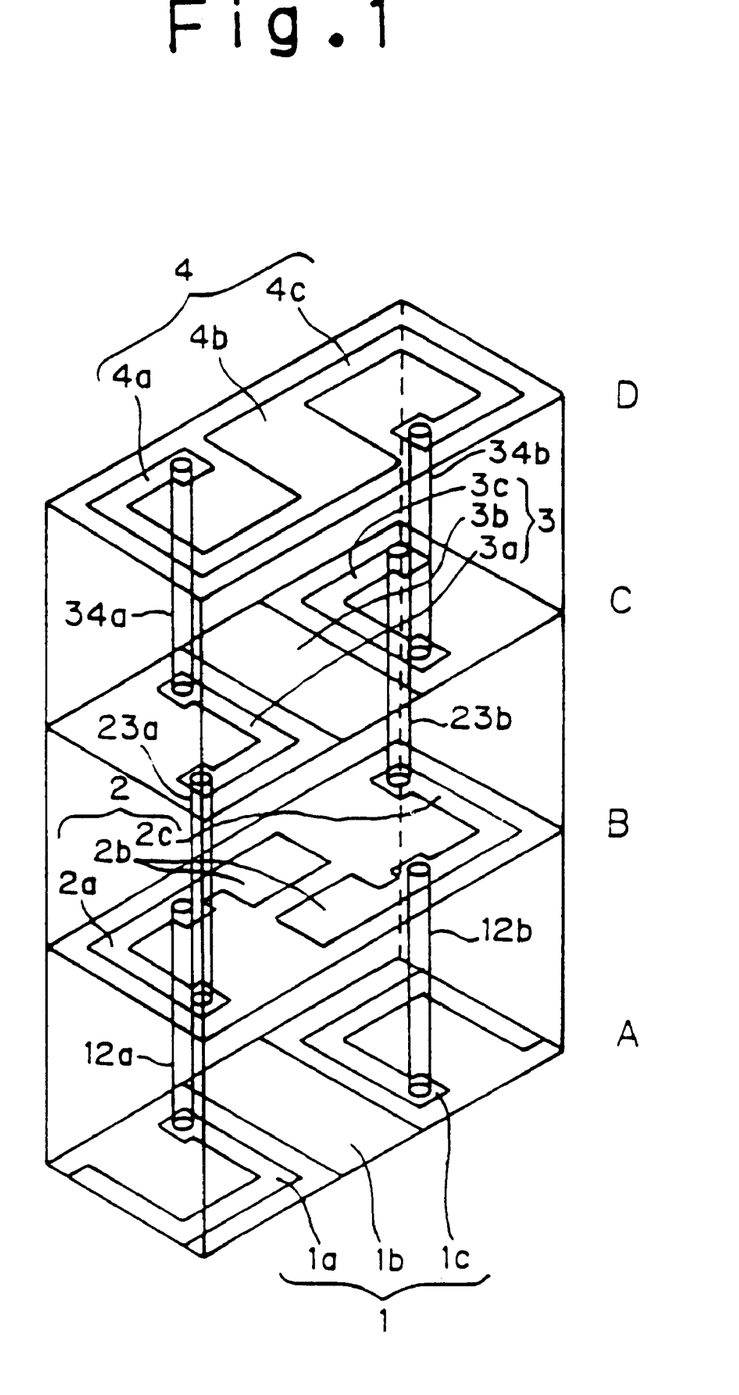
FIG. 1 is a disassembled perspective view of an LC composite part common to a first, second and third embodiment of the present invention.
Figure 2:
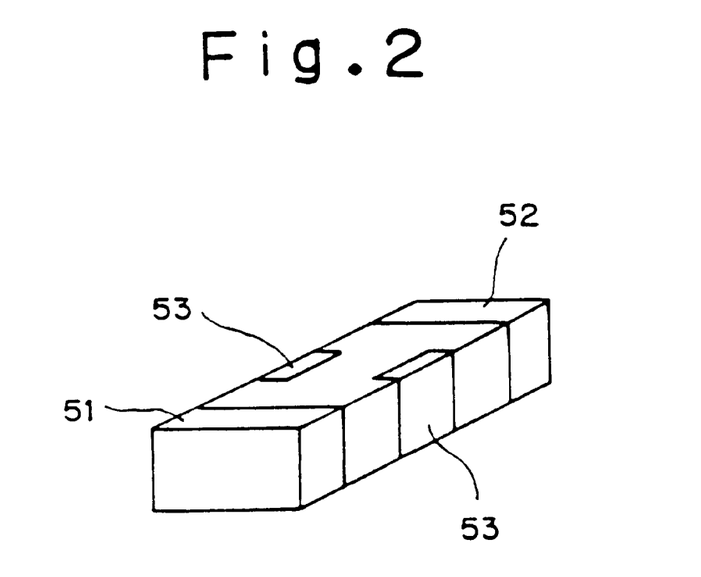
FIG. 2 is an outlook view of the LC composite part common to the first, second and third embodiment of the present invention.
Figure 3:
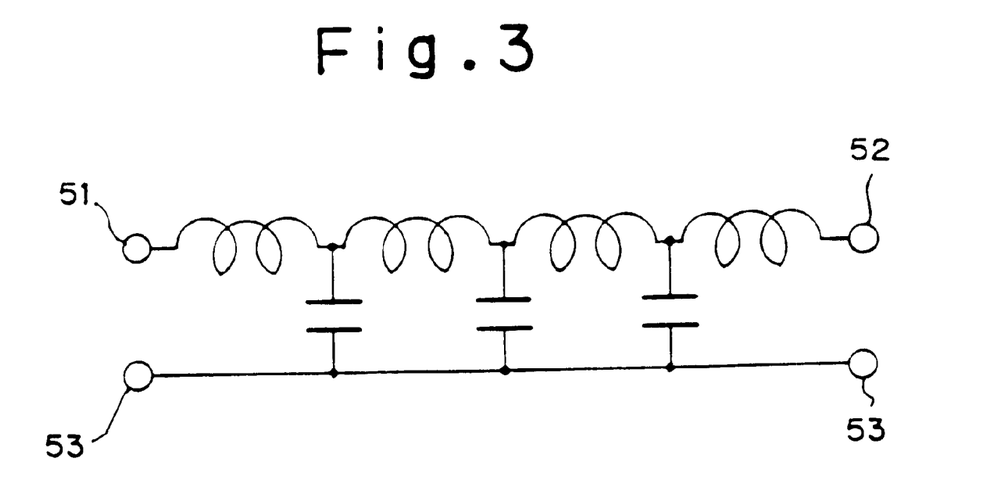
FIG. 3 is an equivalent circuit diagram of the LC composite part common to the first and second embodiments of the present invention.

FIG. 1 is a disassembled perspective view of an LC composite part common to a first, a second and a third embodiment of the present invention, and FIG. 2 is an outlook view thereof. FIG. 3 is an equivalent circuit diagram common to the embodiments of the first and second LC composite parts. Here, an explanation will be given of the embodiment of the first LC composite part according to the present invention and thereafter, an explanation will be given of the embodiments of the second and the third LC composite parts according to the present invention. In addition, an explanation will be given of an equivalent circuit diagram of the embodiment of the third LC composite part according to the present invention.

Referring now to the drawings, wherein like reference numerals designate identical or corresponding parts throughout the several views, there is illustrated in FIG. 1 and FIG. 2 an LC composite part, constituted by four layers where conductive films 1, 2, 3 and 4 are formed on respective layers each including a mixture of a dielectric and a magnetic material. The conductive films 1 2, 3 and 4 are respectively, conductive films of a first layer A, a second layer B, a third layer C and a fourth layer D. The conductive films constituting contiguous layers in a vertical (up and down) direction are electrically connected by conductors using through holes 12*a*, 12*b*; 23*a*, 23*b*; and 34*a*, 34*b*.

The conductive films each having a spiral structure are respectively formed by conductive films 1*a*, 2*a*, 3*a*, 4*a* and 1*c*, 2*c*, 3*c*, and 4*c* at both sides extending over the four layers. As shown in FIG. 1, the conductive films are spiraled in mutually reverse directions and are connected to each other via a conductive film 4*b* of the fourth layer. Further, capacitors are formed by conductive films 1*b*, 2*b*, 3*b* and 4*b* at central portions of the four layers. Thereby, a multi-stage type LC filter circuit shown by an equivalent circuit of FIG. 3 is formed.

As shown in FIG. 2, the conductive films 1a and 1c of the first layer are exposed from end faces of a substrate constituted by laminating the respective layers by which both terminals of the spiral structure are respectively connected to a terminal electrode 51 and a terminal electrode 52. In addition, the central conductive film 1b of the first layer and the central conductive film 3b of the third layer are exposed from side faces of the substrate by which the conductive films 1b and 3b are connected to ground electrodes 53.

Figure 4:
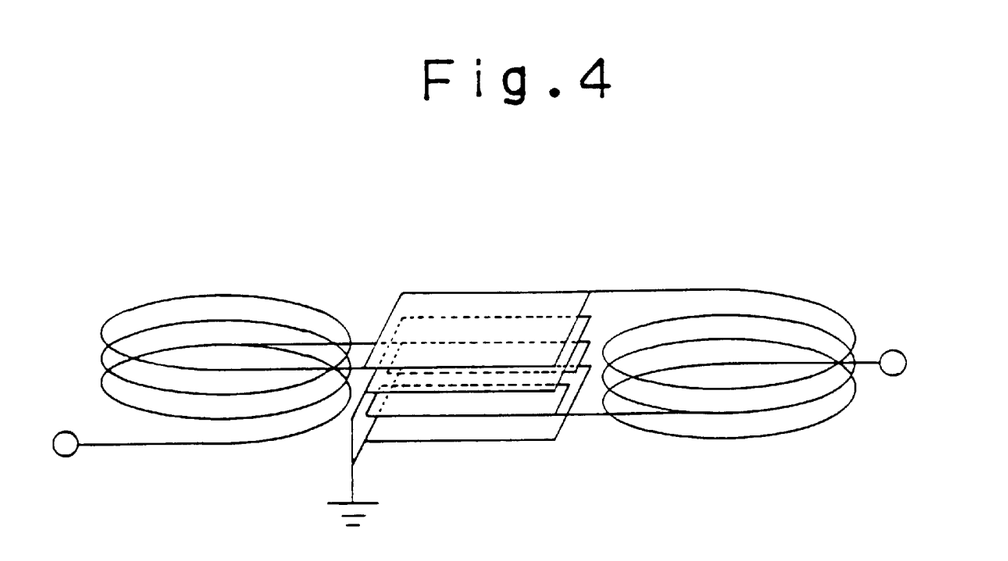
FIG. 4 is a schematic arrangement view of a filter circuit having the structure shown by FIG. 1.
Figure 5:
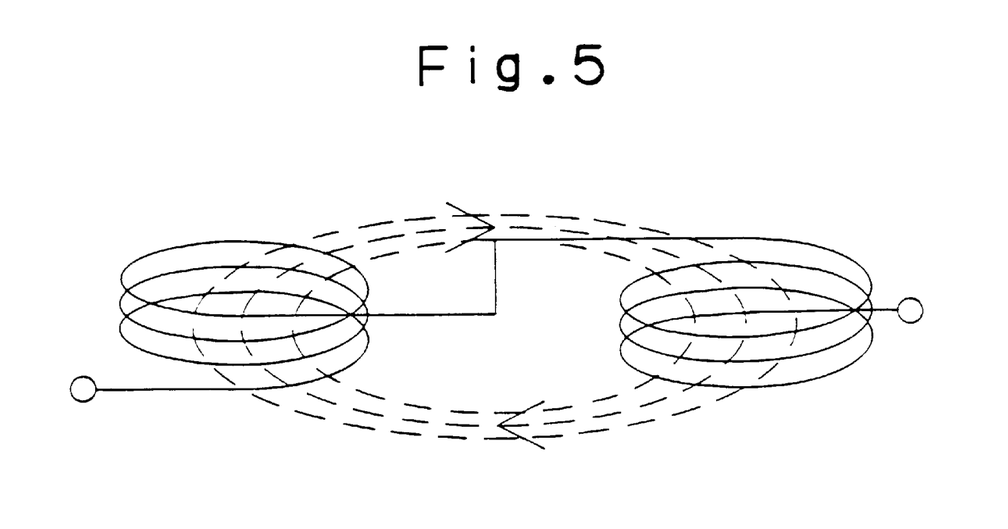
FIG. 5 is a schematic showing a magnetic field extending over two spiral structures.

FIG. 4 is a schematic of the filter circuit having the structure shown in FIG. 1, and FIG. 5 illustrates a magnetic field extending over two spiral structures.

As shown in FIG. 4, the filter circuit having the structure shown in FIG. 1 is provided with inductors each having a spiral structure at both sides and capacitors are provided at the center of the two spiral structures. The two spiral structures are formed in mutually reverse directions, and accordingly magnetic fluxes at the inside of the two spiral structures are in parallel to each other and directed in mutually reverse directions. Therefore, a magnetically closed circuit shown in FIG. 5 is formed. Thus, almost no magnetic field exits at the portions of the capacitors arranged in the central portion of the two spiral structures. Accordingly, the capacitors can achieve desired characteristics as they are not receiving adverse influence caused by the magnetic field.

Further, since the magnetically closed circuit is formed between the two spiral structures, magnetic fluxes leaking outside of the electronic circuit part are extremely weak. Therefore, even if another circuit element is arranged near the electronic circuit part, almost no magnetic field effects the circuit element.

Figure 12A:
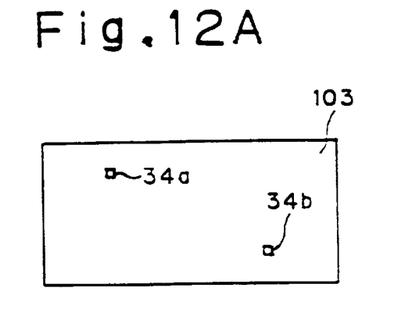
FIGS. 12A and 12B are views showing a seventh step in respective fabrication steps of the LC composite part shown in FIG. 1.
Figure 12B:
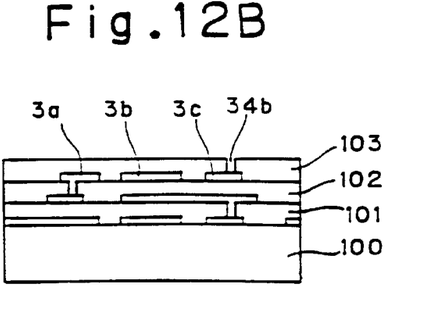
Figure 13A:
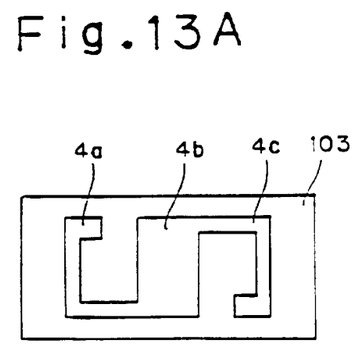
FIGS. 13A and 13B are views showing an eighth step in respective fabrication steps of the LC composite part shown in FIG. 1.
Figure 13B:
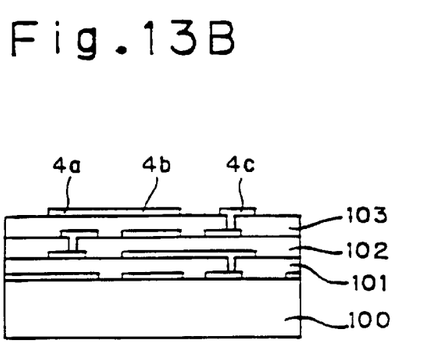
Figure 14A:
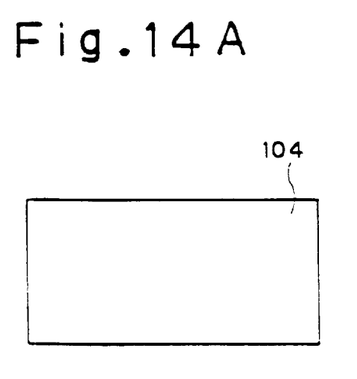
FIGS. 14A and 14B are views showing a ninth step in respective fabrication steps of the LC composite part shown in FIG. 1.
Figure 14B:
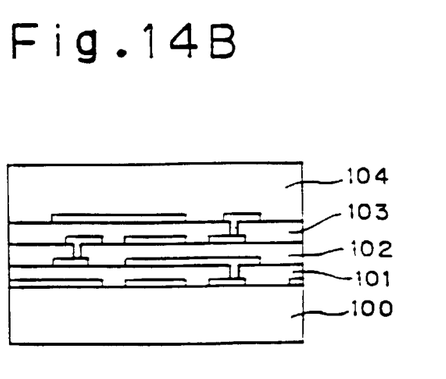

FIG. 6A through FIG. 14B are views showing respective fabrication steps of the LC composite part shown in FIG. 1. In particular FIG. 6A, FIG. 7A, FIG. 8A, . . . , and FIG. 14A are plane views and FIG. 6B FIG. 7B, FIG. 8B, . . . , and FIG. 14B are sectional views taken along an arrow designated A—A shown in FIG. 8A.

In this embodiment, a paste mixed with a dielectric and a magnetic material is formed by mixing in a pertinent rate of a magnetic calcinated powder, which is formed by mixing and calcinating a magnetic material having a major component of, for example, Ni-Zn ferrite and crushing the material to constitute a pertinent particle size, and a dielectric calcinated powder that is formed by mixing and calcinating a dielectric material having a major component of, for example, $PbTiO_3$ and crushing the material to constitute a pertinent particle size, and adding a dispersant, a binder, a plasticizer, a solvent and the like. As explained below, the paste mixed with the dielectric and magnetic material and a conductive paste having a major component of Ag or Pd are alternately laminated by performing screen printing and cutting the assemblage as necessary to form a green laminated body. The laminated body is subjected to a binder removing treatment and is further sintered to form a sintered body. In addition, the terminal electrodes 51 and 52 and the ground electrodes 53 (refer to FIG. 2) are formed on the sintered body by using a conductive paste or the like having a major component of, for example, Ag. In this way, the LC composite part is finished.

Hereinafter, an explanation will be given of fabrication steps of the LC composite part shown by FIG. 1 in reference to the respective drawings.

Figure 6A:
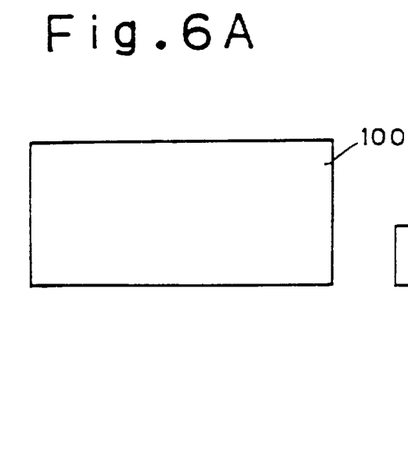
FIGS. 6A and 6B are views showing a first step in respective fabrication steps of the LC composite part shown in FIG. 1.
Figure 6B:
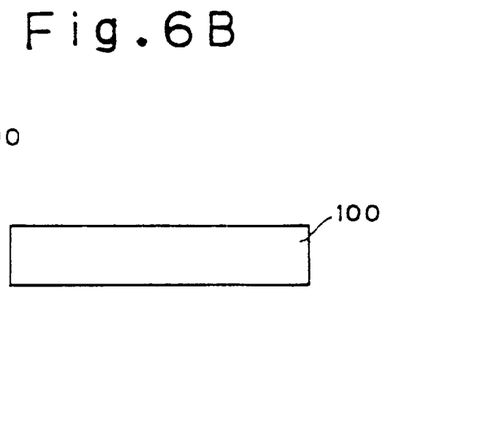
Figure 7A:
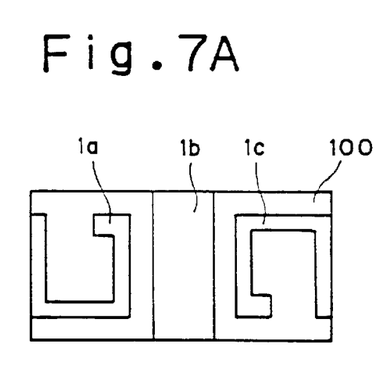
FIGS. 7A and 7B are views showing a second step in respective fabrication steps of the LC composite part shown in FIG. 1.
Figure 7B:
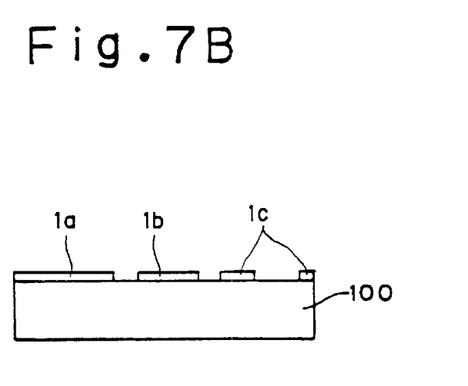
Figure 8A:
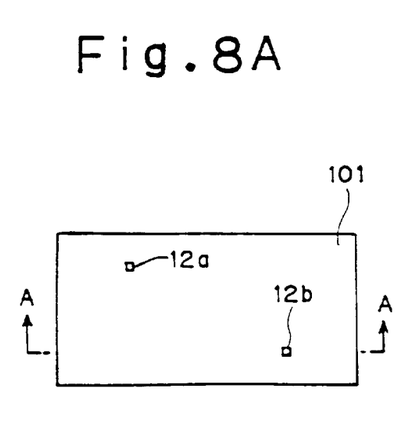
FIGS. 8A and 8B are views showing a third step in respective fabrication steps of the LC composite part shown in FIG. 1.
Figure 8B:
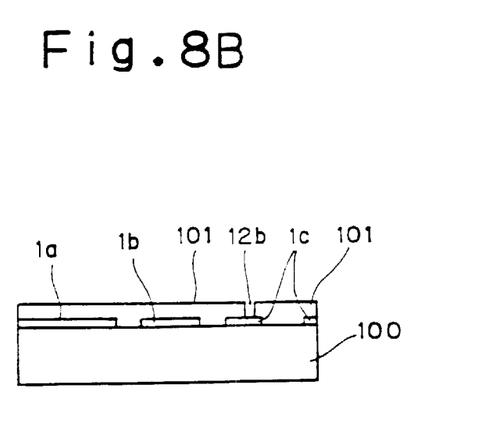
Figure 9A:
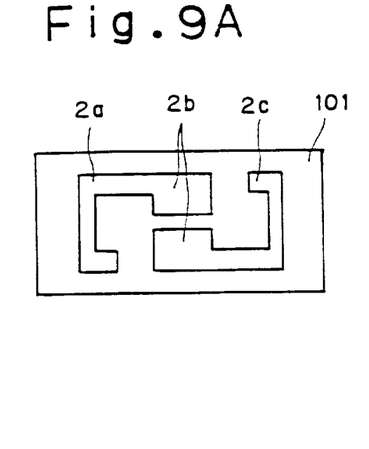
FIGS. 9A and 9B are views showing a fourth step in respective fabrication steps of the LC composite part shown in FIG. 1.
Figure 9B:
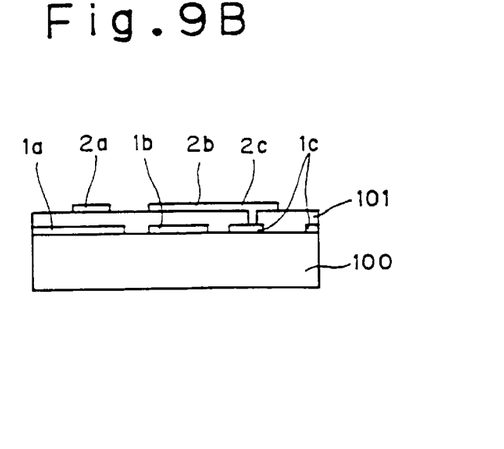
Figure 10A:
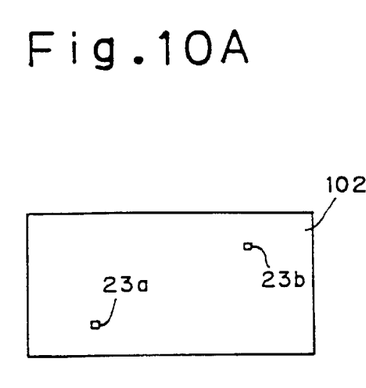
FIGS. 10A and 10B are views showing a fifth step in respective fabrication steps of the LC composite part shown in FIG. 1.
Figure 10B:
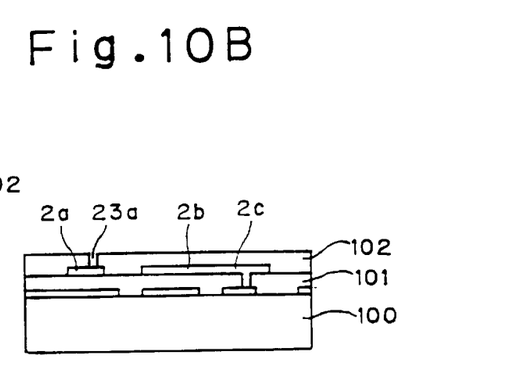
Figure 11A:
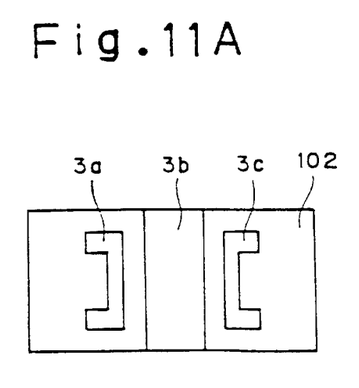
FIGS. 11A and 11B are views showing a sixth step in respective fabrication steps of the LC composite part shown in FIG. 1.
Figure 11B:
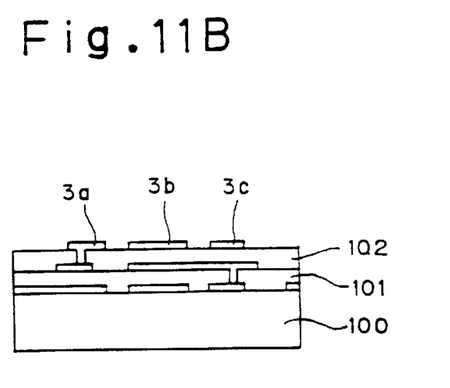

First, as shown in FIG. 6A and FIG. 6B, a base substrate 100 including the paste mixed with the dielectric and magnetic material discussed above is formed. In addition, the conductive films 1a, 1b and 1c of the first layer are formed on the base substrate 100 by screen printing of a conductive paste (FIG. 7A and FIG. 7B). Further, a layer 101 mixed with the dielectric and magnetic material is formed by screen-printing having through holes 12a and 12b (FIG. 8A and FIG. 8B). Similarly, the conductive films 2a, 2b and 2c of the second layer are formed with the conductive paste (FIG. 9A and FIG. 9B). The conductive paste is filled in through holes 12a and 12b forming an electric connection of the conductive films of the second layer to the conductive films of the first layer. Further, a layer 102 mixed with the dielectric and magnetic material having through holes 34a and 34b is formed thereon (FIG. 10A and FIG. 10B). The conductive films 3a, 3b and 3c of the third layer are formed on top of the layer 102 (FIG. 11A and FIG. 11B). Further, a layer 103 mixed with the dielectric and magnetic material is formed thereon having through holes 34a and 34b (FIG. 12A and FIG. 12B). Similarly, the conductive films 4a, 4b and 4c of the fourth layer are formed on top of layer 103 (FIG. 13A and FIG. 13B). In addition, a base substrate 104 is formed over the fourth layer. The conductive paste is filled in through holes 23a, 23b, 34a and 34b similar to through holes 12a and 12b.

After forming a laminated body as mentioned above, the laminated body is subjected to a binder removing treatment and sintered to form a sintered body. The terminal electrodes 51 and 52 and the ground electrodes 53 are formed at continuously connected external faces of the sintered body as shown in FIG. 2. The LC composite part having the structure shown in FIG. 1 and FIG. 2 may be fabricated as described above.

Further, a multi-stage filter circuit may be constituted by repeating the above-described fabrication steps. That is, by following the step shown in FIG. 8A and FIG. 8B to the step shown in FIG. 11A and FIG. 11B.

In the following description, an explanation will be given of the structure of the LC composite part having only one spiral structure at an inside thereof. In addition, the LC composite part is compared with the LC composite part having the structure shown in FIG. 1.

Figure 15:
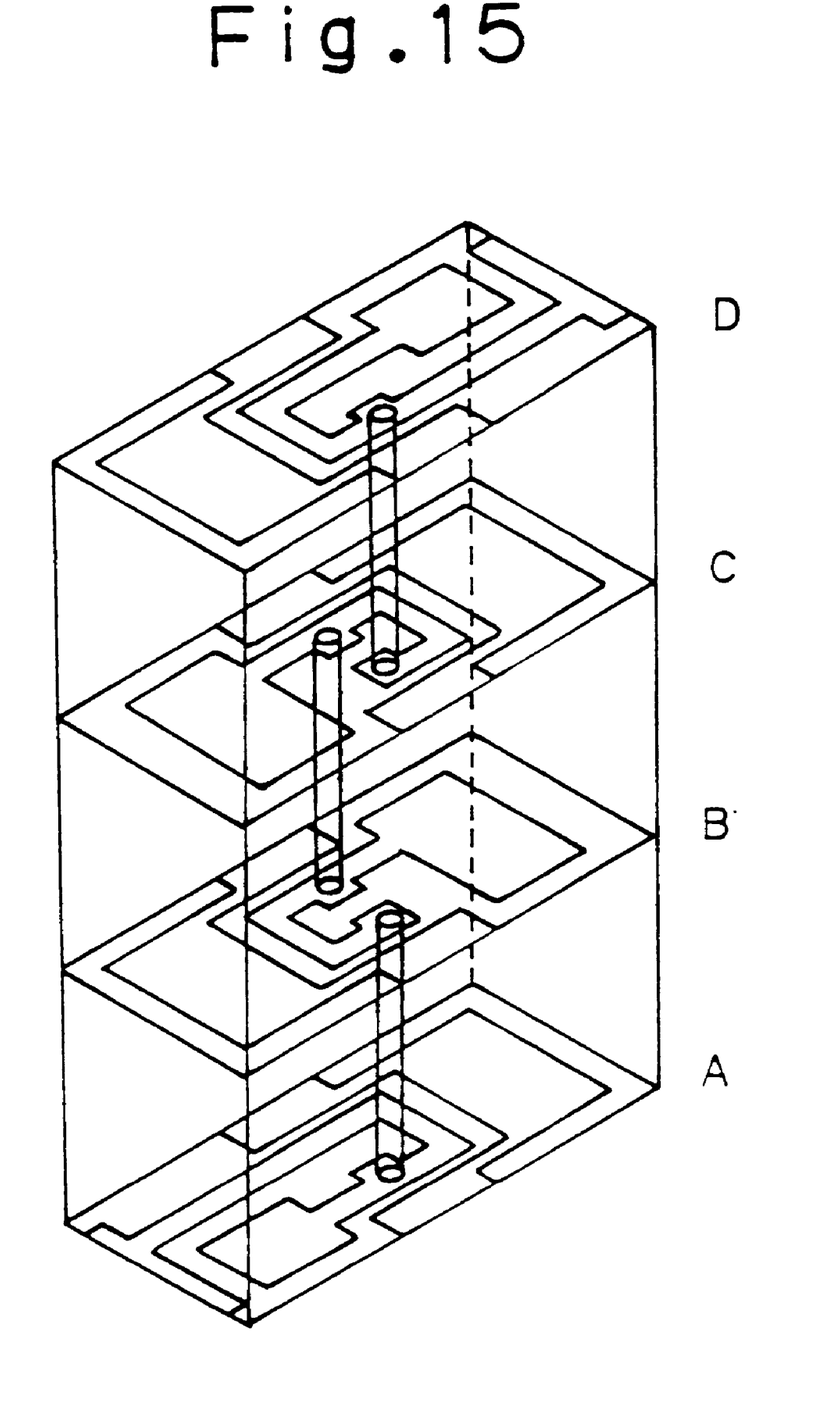
FIG. 15 is a disassembled perspective view of an LC composite part having a single spiral structure.
Figure 16:
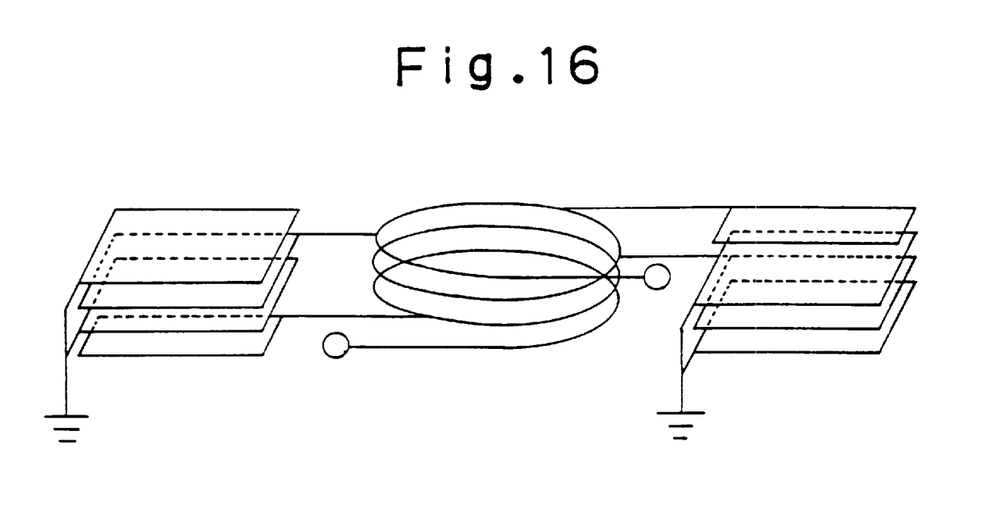
FIG. 16 is a schematic arrangement view of the LC composite part shown in FIG. 15.
Figure 17:
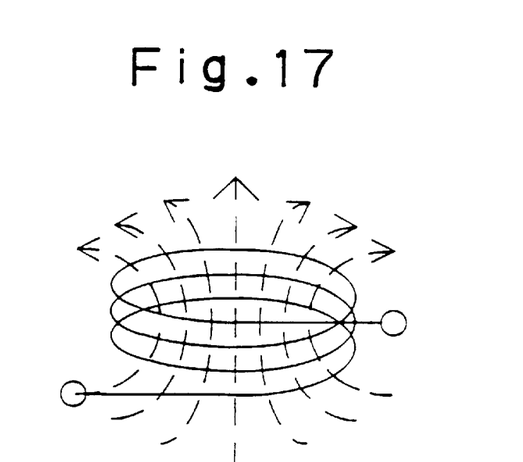
FIG. 17 is a schematic showing a magnetic field having a spiral structure according to the LC composite part shown in FIG. 15.

FIG. 15 is a disassembled perspective view of an LC composite part having only one spiral structure at an inside thereof. FIG. 16 is a schematic arrangement view of a filter circuit using the LC composite part, and FIG. 17 is a schematic showing a magnetic field having a spiral structure in respect of the LC composite part shown in FIG. 15.

The patterns of conductive films and positions of the through holes of the LC composite part shown in FIG. 15 are different from those in the LC composite part shown in FIG. 1. Thereby, as shown in FIG. 16, an inductor having a spiral structure is formed at a central portion and capacitors are formed at both sides thereof. Incidentally, the appearance and the equivalent circuit thereof are the same as the appearance (refer to FIG. 2) and the equivalent circuit (refer to FIG. 3) of the LC composite part shown in FIG. 1. As shown in FIG. 17, a magnetic field formed by the inductor having a spiral structure shown in FIG. 15 has an influence on capacitors contiguous to the inductor.

Figure 18:
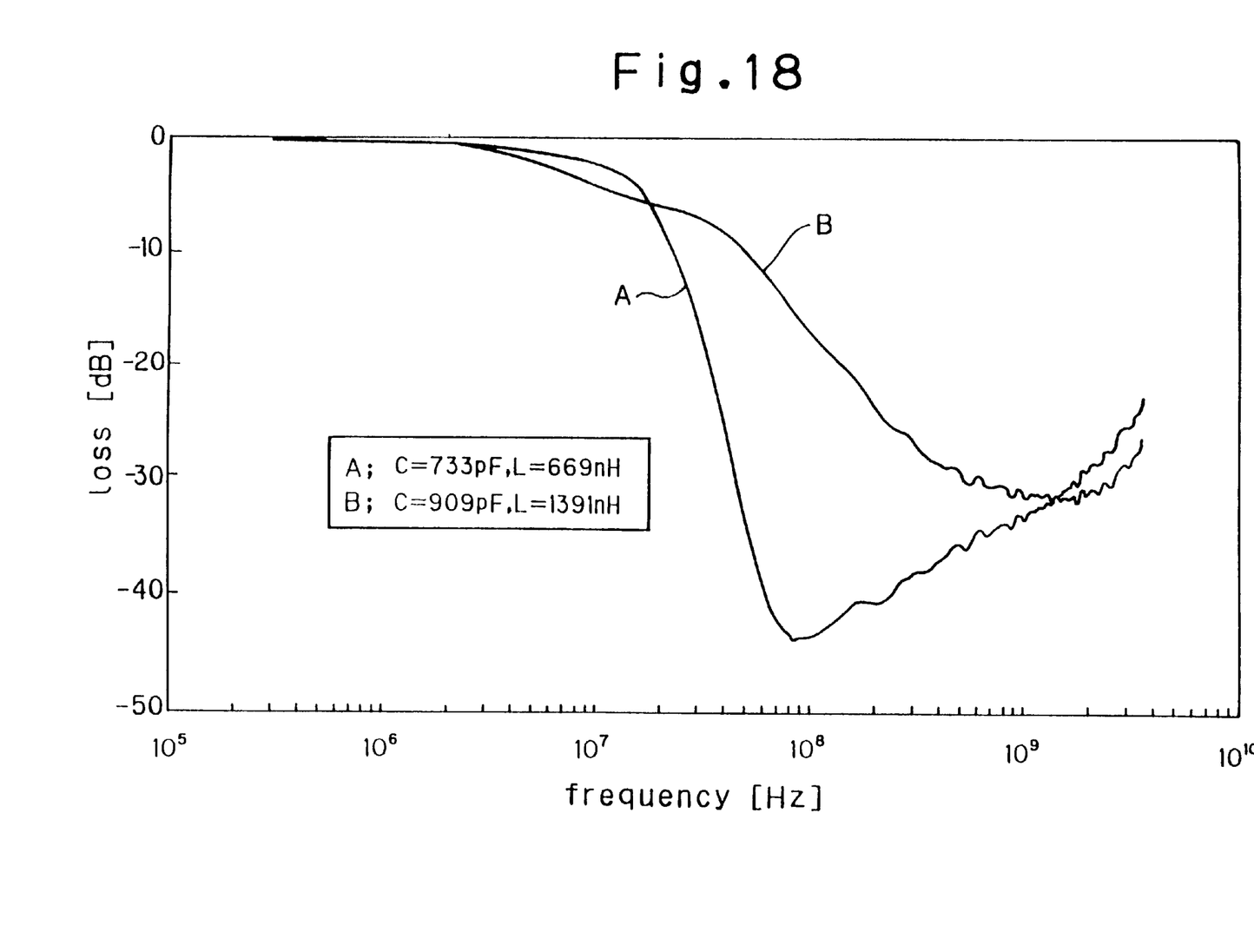
FIG. 18 is a graph showing experimental data of filter characteristics for the filter having left and right windings spiral structures shown in FIG. 1, and for the filter having one central winding spiral structure shown in FIG. 15.

FIG. 18 is a graph showing experimental data of the filter characteristic A of the filter having left and right winding spiral structures shown in FIG. 1 and the filter characteristic B of the filter having one central winding spiral structure shown in FIG. 15.

In this example case, the following experimental conditions have been adopted.

(a) Material composition: Ni—Zn—Cu group ferrite, $PbTiO_3$ group dielectric=6:4 (weight ratio);

(b) Conductive material: Ag/Pd;
(c) Layer thickness: 12 μm;
(d) Inductor: inner sectional area of 0.71 mm², line width of 0.20 mm;
(e) Capacitor: opposed electrode area of 0.64 mm² (per layer); and
(f) In the above-described fabrication steps, the steps from FIGS. 8A and 8B to FIG. 11A and FIG. 11B are repeated twice. That is, the second layer and third layers shown in FIG. 1 and FIG. 15 are alternately doubled.

Under the above-described conditions, an LC composite part having the structure shown in FIG. 1 and an LC composite part having the structure shown in FIG. 15 was constructed. However, the number of layers used were larger than those of the respective layers shown in FIG. 1 and FIG. 15. The measured characteristics resulted in an attenuation coefficient of 37.1 dB/dec. for the LC composite part having the structure shown in FIG. 1. The attenuation coefficient for the LC composite part having the structure shown in FIG. 15 was 14.4 dB/dec., which is a significant improvement. This may be due to the influence effected on the capacitors which is significantly reduced by forming the magnetically closed circuit.

Next, an explanation will be given of an LC composite part according to a second embodiment of the present invention.

According to the embodiment of the second LC composite part, similar to the above-described first LC composite part, the description referring to FIG. 1 through FIG. 14B is the same here, and accordingly, a duplicated explanation will be omitted.

In the following description, the filter characteristic of the second solid LC composite part (three layer product, five layer product, seven layer product, mentioned later) each having a plurality of layers mixed with a dielectric and magnetic material, and including inductors having conductive films formed in a spiral shape extending over the plurality of layers as shown in FIG. 1, is compared with the filter characteristic of an LC composite part (one layer product, mentioned later) having only one layer mixed with a dielectric and magnetic material and having an inductor including conductive films formed in a spiral shape on the layer.

When a pair of one inductor and one capacitor is enumerated as a one layer component of a filter circuit as shown in FIG. 3, the second LC composite part having the structure shown in FIG. 1 is constituted by "three layers plus one inductor". This is referred to as a "three layer product". Similarly, LC filters having one, five and seven capacitors are respectively referred to as a "one layer product", "five layer product" and "seven layer product". These LC filters can be formed by modifying the steps shown in FIGS. 6A and 6B to FIGS. 14A and 14B. For example, the "one layer product" can be formed by omitting the steps of FIGS. 8A and 8B to FIGS. 11A and 11B. The "five layer product" can be formed by repeating twice the steps from FIG. 8A and FIG. 8B to FIGS. 11A and 11B. Similarly, the "seven layer product" can be formed by repeating three times the steps from FIGS. 8A and 8B to FIGS. 11A and 11B. In these cases, LC filter parts having similar dimensions are constituted even if the number of layers is increased.

Figure 19:
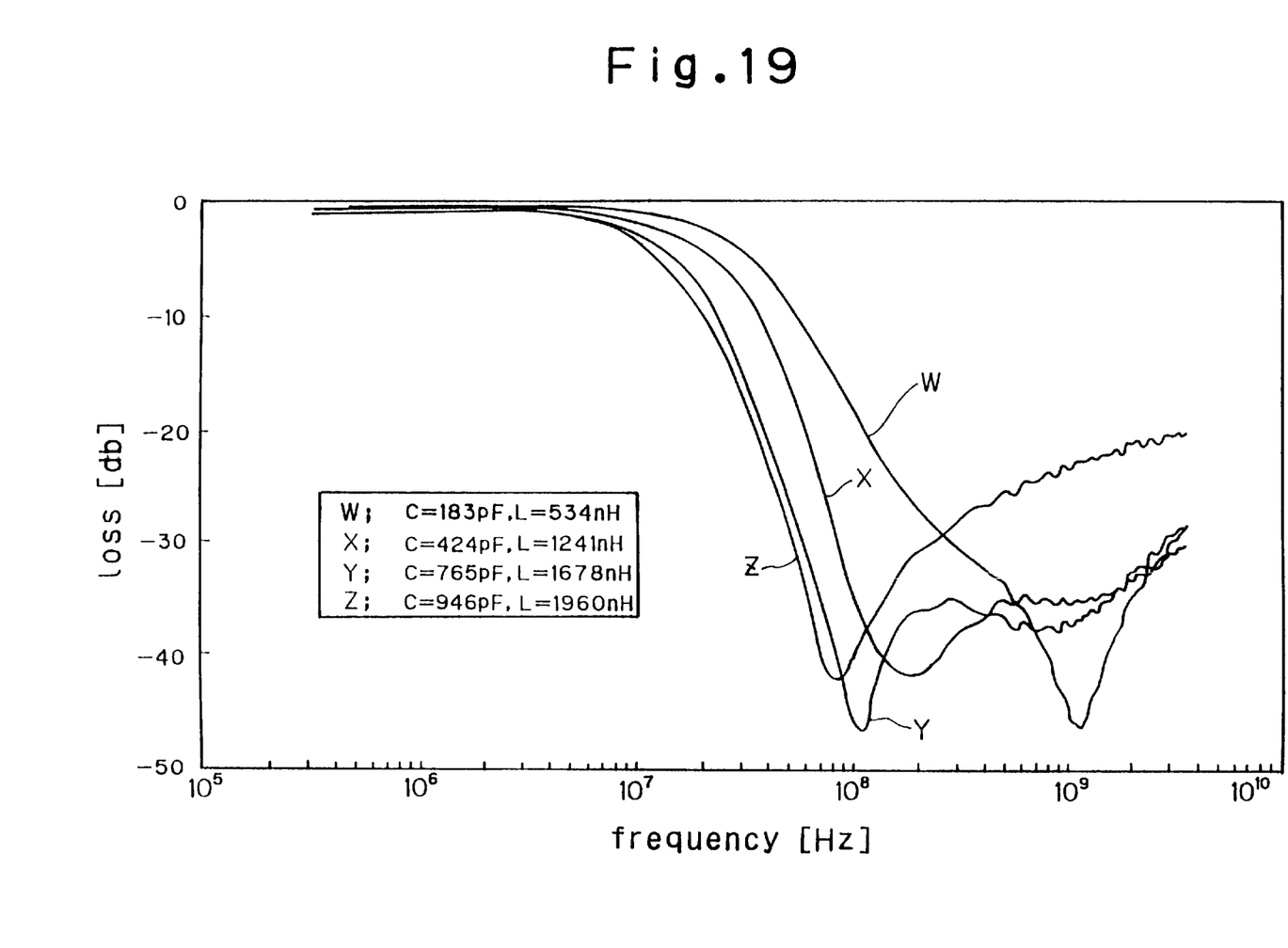
FIG. 19 is a graph showing experimental data of filter characteristics for an LC filter circuits having a one layer product, a three layer product, a five layer product and a seven layer product.

FIG. 19 is a diagram showing experimental data of the characteristics of a one layer product W, a three layer product X, a five layer product Y, and a seven layer product Z filter fabricated as described above.

In this example case, the following experimental conditions have been adopted:

(a) Material composition: Ni-Zn-Cu group ferrite, $PbTiO_3$ group dielectric=6:4 (weight ratio);
(b) Conductive material: Ag/Pd;
(c) Layer thickness: 12 μm;
(d) Inductor: inner sectional area of 0.71 mm², line width of 0.20 mm; and
(e) Capacitor: opposed electrode area of 0.64 mm² (per layer).

Under the above-described conditions, the LC composite parts, basically having the structure shown in FIG. 1 with different numbers of layers, was fabricated and the characteristics were measured. As shown in FIG. 19, the LC filter circuits have a steeper attenuation characteristic with respect to an increase in the number of layers. The attenuation coefficients for the respective numbers of layers are approximately, one layer product: 25.8 dB/dec., three layer product: 34.9 dB/dec., five layer product: 37.1 dB/dec., seven layer product: 38.8 dB/dec.

Next, an explanation will be given of an embodiment of a third LC composite part.

Figure 20:
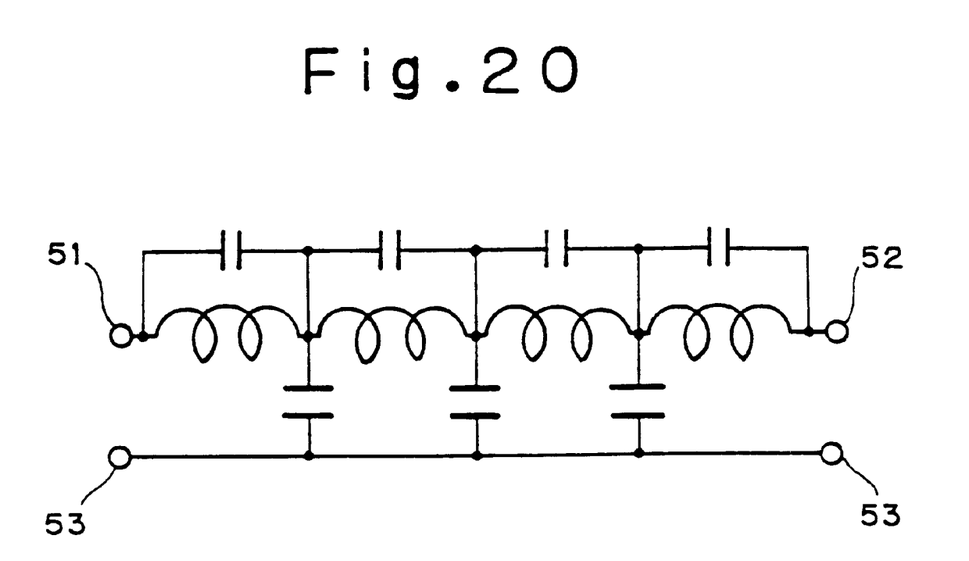
FIG. 20 is an equivalent circuit diagram of one embodiment of a third LC composite part according to the present invention.

With regard to the third LC composite part, the drawings of FIG. 1 through FIG. 14B, except FIG. 3, are referred to as they are. FIG. 20 explained below is referred to in place of FIG. 3. The explanation which has been carried out in reference to FIG. 1, FIG. 2, and FIGS. 4 to 14B is also applicable to the third LC composite part. Accordingly, an explanation of FIG. 20 will now be given, followed by an explanation of a characteristic point of the third LC composite part.

FIG. 20 is an equivalent circuit diagram of the embodiment of the third LC composite part according to the present invention.

According to the equivalent circuit shown in FIG. 20, capacitors are arranged in parallel with the respective inductors of the equivalent circuit shown in FIG. 3. The capacitors are residual capacitors of the inductors.

Here, the third LC composite part represented by the equivalent circuit of FIG. 20, satisfies the above-mentioned Equation (1) by adjusting the line widths and the like of the conductive films 1a, 2a, 3a, 4a, and 1c, 2c, 3c, 4c making the inductors. In this case, a low pass LC filter circuit showing an extremely sharp attenuation characteristic is constituted.

Further, in respect to the fabrication steps of the above-described third LC composite part, similar to the first and the second LC composite parts, FIGS. 6A and 6B through FIGS. 14A and 14B are referred to as they are. The characteristic points in fabricating the third LC filter part reside in the material of the paste mixed with the dielectric and magnetic material, the thickness of screen printing of the paste mixed with the dielectric and magnetic material, and the line widths of screen printing of the conductive paste, which are adjusted so that the residual capacitors of the inductor satisfy Equation (1).

As has been explained above according to the present invention, an LC composite part incorporating capacitors and inductors having a spiral structure preventing adverse influence on the capacitors is constituted.

Further, according to the present invention, a small-sized LC composite part incorporating a multi-stage type LC filter circuit is constituted.

Further, according to the present invention, an LC composite part having excellent filter characteristics by positively utilizing residual capacitors can be provided.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An LC composite part, comprising:
   a substrate including a magnetic material and a dielectric material;
   at least one inductor formed at an inside of the substrate, said at least one inductor having two spiral structures including substantially parallel axes and being arranged and connected to each other so that magnetic fluxes at insides of the spiral structures are parallel and in mutually reverse directions; and
   at least one capacitor comprising parallel plane plates formed at the inside of the substrate,
   wherein said at least one capacitor is positioned between said two spiral structures at a line extending perpendicular to said parallel axes.

2. The LC composite part according to claim 1, wherein said at least one capacitor is connected to an intermediate position of said at least one inductor.

3. An LC composite part, comprising:
   a substrate including a magnetic material and a dielectric material;
   a first and a second terminal electrode formed on end faces of the substrate;
   ground electrodes formed on side faces of the substrate;
   inductors formed at an inside of the substrate having conductor films formed in a spiral shape extending over a plurality of layers arranged between the first terminal electrode and the second terminal electrode, said inductors having substantially parallel axes; and
   at least two capacitors formed at said inside of the substrate and arranged between intermediate points of the inductors different from each other and the ground electrodes, said intermediate points being defined as points on a line extending perpendicular to said parallel axes.

4. An LC composite part, comprising:
   a substrate including a magnetic material and a dielectric material;
   inductors and capacitors formed at an inside of the substrate constituting a low pass LC filter circuit of at least one of a T-type, a π-type and a multi-stage type; and
   wherein when a cut off frequency of the LC circuit is designated by a notation fc, an inductance of at least one of said inductors is designated by a notation L, and a capacitance of at least one residual capacitor connected in parallel to said at least one of said inductors is designated by a notation C, the at least one residual capacitor is provided with a capacitance satisfying the following equation:

$\log(fc)+0.6 \leq \log\{1/[2(2\pi\sqrt{(LC)})]\} \leq \log(fc)+1.5.$

5. An LC filter comprising:
   a base substrate; and
   a plurality of layers formed on said base substrate,
   wherein at least one of said plurality of layers comprises at least one inductor and at least one capacitor, said at least one inductor having two spiral structures including substantially parallel axes and being arranged and connected to each other so that magnetic fluxes at insides of said two spiral structures are parallel and in mutually reverse directions,
   wherein said at least one capacitor is positioned between said two spiral structures at a line extending perpendicular to said parallel axes.

6. An LC filter according to claim 5, further comprising:
   at least a first and a second ground electrode formed on a surface of said LC filter.

7. An LC filter according to claim 5, wherein said at least one capacitor comprises a conductive film.

8. An LC filter according to claim 5, wherein said at least one of said plurality of layers comprises a magnetic material and a dielectric material.

9. An LC filter according to claim 5, wherein said plurality of layers are connected with a conductive material.

10. An LC filter according to claim 5, wherein said at least one inductor comprises a conductive film.

11. An LC filter according to claim 5, wherein said at least one capacitor is connected to an intermediate position of said at least one inductor.

12. An LC filter according to claim 5, further comprising:
    at least a first and a second terminal electrode formed on a surface of said LC filter.

13. A method of manufacturing an LC filter, comprising the steps of:
    forming at least one layer on a base substrate;
    forming at least one inductor having two spiral structures including substantially parallel axes and being arranged so that magnetic fluxes at insides of said two spiral structures are parallel and in mutually reverse directions on said at least one layer; and
    forming at least one plane plate capacitor on said at least one layer at a position between said two spiral structures defined by a line extending perpendicular to said parallel axes.

14. A method according to claim 13, further comprising the step of:
    connecting said at least one plane plate capacitor to an intermediate position of said at least one inductor.

15. A method according to claim 13, further comprising the step of:
    forming at least a first and a second terminal electrode on a surface of said LC filter.

16. A method according to claim 13, further comprising the step of:
    forming at least a first and a second ground electrode on a surface of said LC filter.

17. A method according to claim 13, wherein said at least one layer comprises a magnetic material and a dielectric material.

18. A method according to claim 13, further comprising the step of:
    connecting each of said at least one layer with a conductive material.

19. An LC filter, comprising:
    means for forming at least one layer on a base substrate;
    means for forming at least one inductor having two spiral structures including substantially parallel axes and being arranged so that magnetic fluxes at insides of said two spiral structures are parallel and in mutually reverse directions on said at least one layer; and
    means for forming at least one plane plate capacitor on said at least one layer at a position between said two spiral structures defined by a line extending perpendicular to said parallel axes.

20. An LC filter according to claim 19, further comprising:

means for connecting each of said at least one layer with a conductive material.

21. An LC filter according to claim 19, further comprising:

means for connecting said at least one plane plate capacitor to an intermediate position of said at least one inductor.

22. An LC filter according to claim 19, further comprising:

means for forming at least a first and a second terminal electrode on a surface of said LC filter.

23. An LC filter according to claim 19, further comprising:

means for forming at least a first and a second ground electrode on a surface of said LC filter.

24. An LC filter according to claim 19, wherein said at least one layer comprises a magnetic material and a dielectric material.

* * * * *